(12) United States Patent
Liu et al.

(10) Patent No.: US 10,689,747 B2
(45) Date of Patent: Jun. 23, 2020

(54) EVAPORATION DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Yaoyang Liu, Shanghai (CN); Jian Xu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 505 days.

(21) Appl. No.: 15/487,442

(22) Filed: Apr. 14, 2017

(65) Prior Publication Data
US 2017/0218499 A1    Aug. 3, 2017

(30) Foreign Application Priority Data
Nov. 18, 2016   (CN) .......................... 2016 1 1020039

(51) Int. Cl.
C23C 16/00 (2006.01)
C23C 14/04 (2006.01)
C23C 14/24 (2006.01)

(52) U.S. Cl.
CPC ............ *C23C 14/042* (2013.01); *C23C 14/24* (2013.01)

(58) Field of Classification Search
CPC ............. C23C 14/042; Y10T 29/49803; Y10T 29/53083
See application file for complete search history.

(56) References Cited

U.S. PATENT DOCUMENTS

| 4,694,888 A * | 9/1987 | Yoshida ............... B22D 11/015 164/467 |
| 4,963,921 A * | 10/1990 | Kariya ...................... G03F 1/22 269/8 |
| 5,117,139 A * | 5/1992 | Flom .................... F16C 32/0438 310/90.5 |
| 5,656,141 A * | 8/1997 | Betz ........................ C23C 14/32 118/723 EB |
| 6,500,497 B1 * | 12/2002 | Wang ..................... B82Y 25/00 427/127 |
| 2003/0010288 A1 * | 1/2003 | Yamazaki ............. C23C 14/042 118/715 |

(Continued)

FOREIGN PATENT DOCUMENTS

| CN | 101106052 A | 1/2008 |
| JP | 5665980 A | 6/1981 |

(Continued)

*Primary Examiner* — Keath T Chen
(74) *Attorney, Agent, or Firm* — Kilpatrick Townsend & Stockton, LLP

(57) ABSTRACT

An evaporation device including an evaporation chamber and mask supporting coils is provided. The mask supporting coils include at least a first coil and a second coil disposed opposite to each other. A mask disposing area is disposed between the first coil and the second coil. A first current is provided in the first coil, and a second current is provided in the second coil, so that a magnetic field with a homogeneous magnetic field strength is generated in the mask disposing area.

29 Claims, 15 Drawing Sheets

(56) References Cited

U.S. PATENT DOCUMENTS

| | | | |
|---|---|---|---|
| 2005/0166850 A1* | 8/2005 | Li | B01J 19/0046 |
| | | | 118/730 |
| 2006/0057240 A1* | 3/2006 | Koinuma | C23C 14/044 |
| | | | 425/223 |
| 2010/0195081 A1* | 8/2010 | Del Puerto | G03F 7/70758 |
| | | | 355/72 |
| 2014/0014929 A1* | 1/2014 | Lee | B05D 1/60 |
| | | | 257/40 |
| 2015/0059643 A1* | 3/2015 | Du | C23C 14/042 |
| | | | 118/504 |

FOREIGN PATENT DOCUMENTS

| | | |
|---|---|---|
| JP | 10152776 A | 6/1998 |
| JP | H10152776 A | 6/1998 |
| JP | 2008075128 A | 4/2008 |

\* cited by examiner

EVAPORATION DEVICE

CROSS-REFERENCE TO RELATED APPLICATIONS

This application claims priority to a Chinese patent application No. 201611020039.5, filed on Nov. 18, 2016, and entitled "Evaporation Device", the disclosure of which is incorporated herein by reference in entirety.

TECHNICAL FIELD

Embodiments of the present disclosure relate to evaporation technologies, in particular to an evaporation device.

BACKGROUND

Evaporation is a process of disposing a substance to be formed as a film in vacuum to evaporate/sublimate and precipitate on a surface of a substrate or work piece. Heating evaporation material and plating it on the substrate is called vacuum evaporation or vacuum plating. Vacuum plating process is widely used in manufacturing processes of devices (such as display panels).

A mask is used for covering a certain area of a glass substrate in an evaporation process of a display panel, so that the evaporation material is precipitated in the uncovered area to form a film. Theoretically, a surface of the mask should be parallel to the glass substrate. In this case, a result of the evaporation should correspond to the mask exactly, and be consistent with the design.

In practice, however, a central area of the mask will be significantly deformed, because edges of the mask are fixed on a supporting frame, and the mask is ultrathin (thickness of the mask is dozens of micrometers) and suffered imbalanced forces. Under influence of the deformation, the film formed on the glass substrate deviates from an expectation situation, leading to bad evaporation effect of the evaporation device. Further, if the mask suffers a force in a vertical direction which varies greatly in the process of fixing the mask, the mask will impact the glass substrate with a very high velocity, thereby causing the glass substrate and the mask to be damaged. Furthermore, if the mask suffers a force in the horizontal direction, a problem of scratching photo spacers on the glass substrate may be caused.

SUMMARY

The objectives of embodiments of the present disclosure are provide an evaporation device, so as to avoid an undesirable phenomenon that the mask deforms because the central area thereof suffers from non-equilibrium force, and to solve a problem that the mask is subjected to a force in the vertical direction and the horizontal direction, thereby improving the evaporation effect of the evaporation device.

Embodiments of the present disclosure provide an evaporation device including an evaporation chamber and mask supporting coils. The mask supporting coils at least include a first coil and a second coil disposed opposite to each other, a mask disposing area between the first coil and the second coil. A first current is provided in the first coil, a second current is provided in the second coil, so that a magnetic field with a homogeneous magnetic field strength is generated in the mask disposing area.

DETAILED DESCRIPTION

The disclosure will be further described in detail below in conjunction with the accompanying drawings and embodiments. It should be noted that the specific embodiments disclosed herein are intended for explaining, rather than limiting, the disclosure. It should also be noted that the accompanying drawings show only parts related to the disclosure, but not in an exhaustive way, for the ease of description.

Figure 1A:
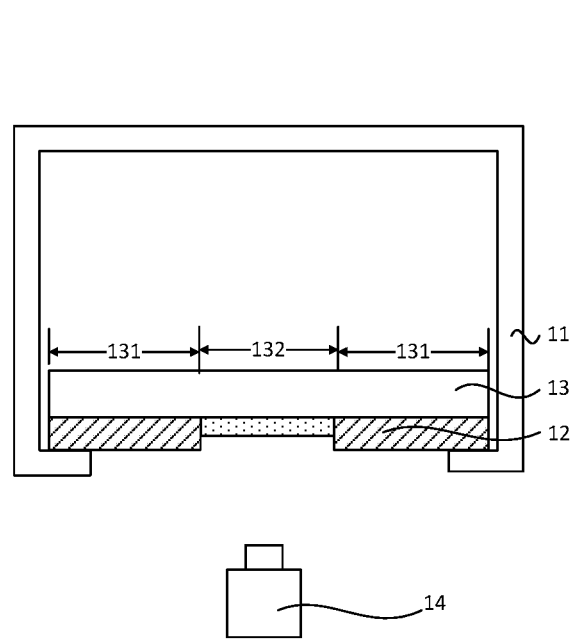
FIG. 1A is a schematic diagram showing an ideal structure of an existing evaporation device in an evaporation process.
Figure 1B:
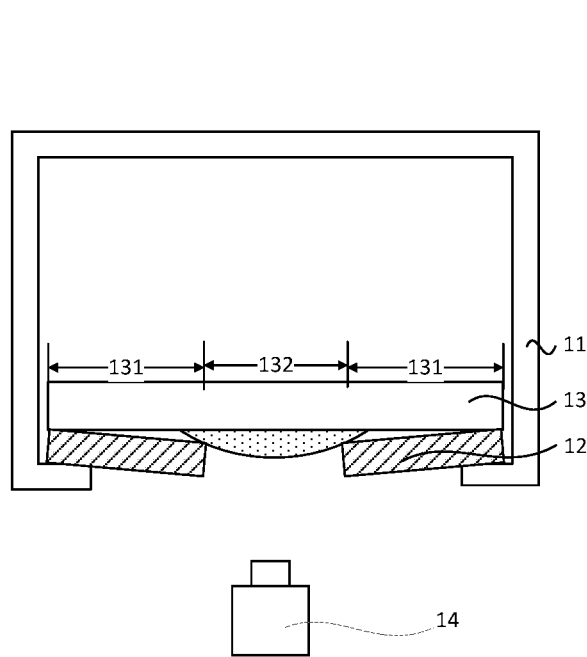
FIG. 1B is a schematic diagram showing an actual structure of the existing evaporation device in the evaporation process.

FIG. 1A is a schematic diagram showing an ideal structure of an existing evaporation device in an evaporation process, and FIG. 1B is a schematic diagram showing the actual structure of the existing evaporation device in the evaporation process. Referring to FIG. 1A and FIG. 1B, the evaporation device includes an evaporation chamber (not shown), a supporting frame 11 and a mask 12. The edges of the mask 12 are fixed on the supporting frame 11. The mask 12 is disposed at a side of a glass substrate 13. An evaporation source 14 is at the other side of the mask 13 away from the glass substrate 13. The mask 12 is of a hollow structure, which shields a certain area 131 of the glass substrate 13 and exposes an area 132 to be evaporated of the glass substrate 13, so that the evaporation material is precipitated to form a film on the area 132 after being ejected from the evaporation source 14. Comparing FIG. 1A with FIG. 1B, in practice, since the edge of the mask 12 is fixed on the supporting frame 11, the central area of the mask 12 only suffers the gravity in the vertical direction (that is the Z axis). Under the effect of the gravity, the mask 12 is deformed significantly, so that there is a gap between the mask 12 and the glass substrate 13. When the evaporation material is precipitated to form a film on the area 132 to be evaporated of the glass substrate 13, a small amount of the evaporation material will be precipitated at the gap between the mask 12 and the glass substrate 13, thereby deteriorating the evaporation effect of the evaporation device.

If each film of a red, green, blue pixel array is formed by means of evaporation with the existing evaporation device, the edge of a pixel unit of a display panel will overlap with the edge of another pixel unit due to the above described offset which exists in the evaporation process of each film. It is no doubted that the display effect of the display panel is affected, and the display panel is even scraped. Further, the mask will impact the glass substrate with a very high velocity if the mask is subjected to a force with large variations in the vertical direction when being fixed by the evaporation device, thereby damaging the glass substrate and mask. Furthermore, the photo spacers on the glass substrate are also scratched if the mask receives a force in the horizontal direction.

Figure 2:
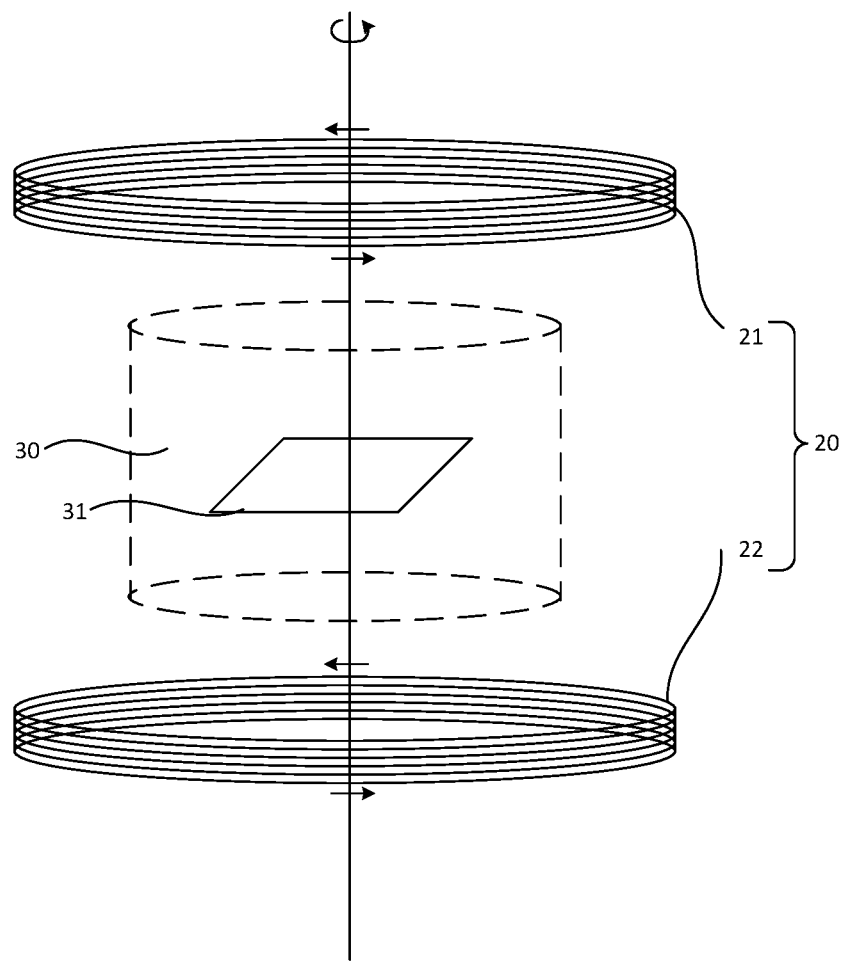
FIG. 2 is a schematic diagram showing an internal structure of an evaporation device according to an embodiment of the present disclosure.

FIG. 2 is a schematic diagram showing the internal structure of an evaporation device according to an embodiment of the present disclosure. Referring to FIG. 2, the evaporation device includes an evaporation chamber (not shown) and mask supporting coils 20. The mask supporting coils 20 at least includes a first coil 21 and a second coil 22 disposed opposite to each other. A mask disposing area 30 is included between the first coil 21 and the second coil 22. A first current and a second current are provided in the first coil 21 and the second coil 22 respectively, so that a magnetic field strength of a magnetic field generated in the mask disposing area 30 is homogeneous.

Optionally, referring to FIG. 2, the evaporation device further includes a mask 31 made from ferromagnetic material. The mask 31 of ferromagnetic material is subjected to an attraction force from the mask supporting coils 20 in the mask disposing area 30. Under mutual effects of the attraction force and the gravity, or under mutual effects of the attraction force, the supporting force exerted on the mask 31 by the supporting frame and the gravity, each position of the mask 31 is in force equilibrium. As a result, the undesired phenomenon that the mask 31 is deformed due to non-equilibrium forces can be effectively avoided.

Optionally, flowing directions of the currents of all coils included in the mask supporting coils are the same as a first winding direction. Herein, the first winding direction may be a clockwise direction or a counterclockwise direction. Further, a product of the magnitude of the current of each coil included in the mask supporting coils and turns of each coil has a same value. Axes of coils included in the mask supporting coils coincide. Exemplarily, since the mask supporting coils 20 in FIG. 2 only include the first coil 21 and the second coil 22, the flowing direction of the first current in the first coil 21 and the flowing direction of the second current in the second coil 22 are both same as the first winding direction. As shown in FIG. 2, the first winding direction is the counterclockwise direction. A product of the first current in the first coil 21 and the turns of the first coil 21 is equal to a product of the second current in the second coil 22 and the turns of the second coil 22. The axis of the first coil 21 and the axis of the second coil 22 coincide.

Figure 3:
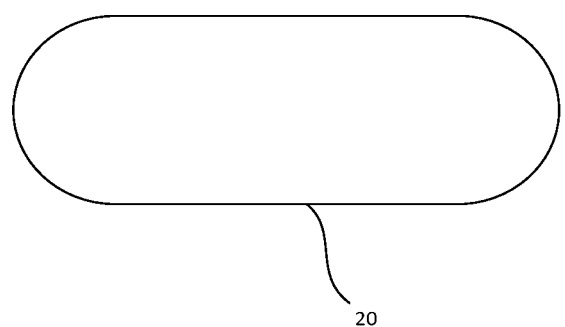
FIG. 3 is a schematic diagram showing a shape of another mask supporting coils according to an embodiment of the present disclosure.

Each coil included in the mask supporting coils may be in a symmetric shape or an asymmetric shape. In the case that each coil included in the mask supporting coils is in a symmetric shape, each coil may be circular, polygonal, elliptical and the like. As shown in FIG. 2, each of the first coil 21 and the second coil 22 is circular. FIG. 3 is a schematic diagram showing the shape of another mask supporting coils according to an embodiment of the present disclosure. Each coil included in the mask supporting coils 20 may be racetrack-shaped shown in FIG. 3.

Noted that, since the shapes of coils in the mask supporting coils 20 are different, different conditions are required to be met for generating a magnetic field with a homogeneous magnetic field strength in the mask disposing area 30 by the mask supporting coils 20. Taking mask supporting coils 20 only having a circular first coil 21 and a circular second coil 22 as an example below, the conditions, which are required to be met for generating a magnetic field with a homogeneous magnetic field strength by the mask supporting coils 20, are derived. For the sake of easy calculating, only a magnetic field generated at the axis of the second coil 22 by the mask supporting coils 20 is derived as an example.

Figure 4A:
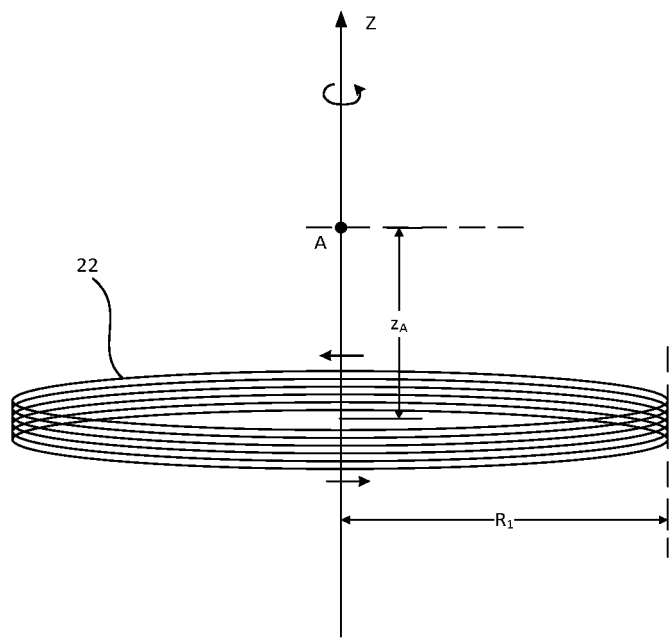
FIGS. 4A and 4B are schematic diagrams showing a derivation process of a condition to be met when a magnetic field with a homogeneous magnetic field strength is generated by the mask supporting coils.
Figure 4B:
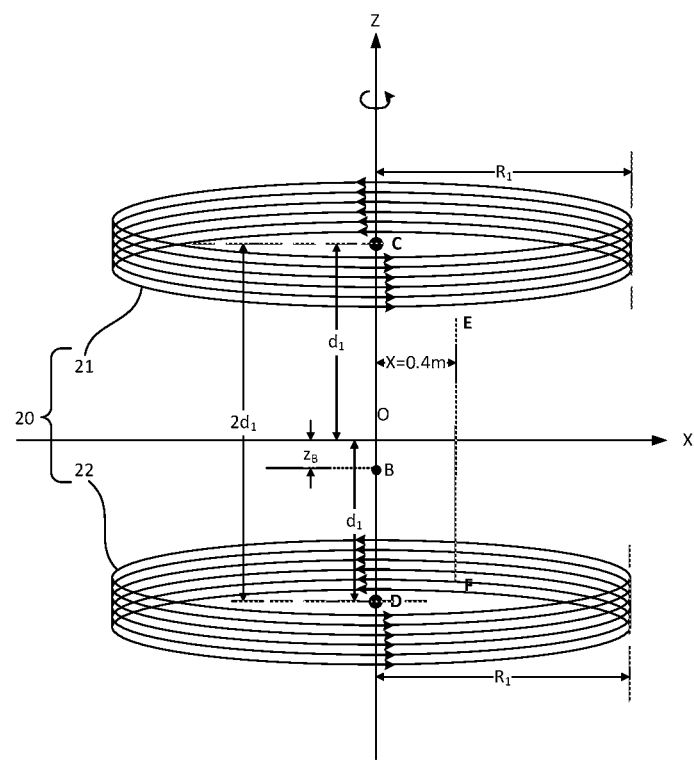

FIGS. 4A and 4B are schematic diagrams showing a process of deriving a condition which is required to be met for generating a magnetic field with a homogeneous magnetic field strength by the mask supporting coils. Referring to FIG. 4A, taking a straight line where the axis of the second coil 22 lies in as axis Z, the magnetic field's magnetic induction intensity $B_{z1}'$ formed at point A on the axis (namely axis Z) by the second coil 22 is:

$$B_{Z1}'=\mu_0 I_1 R_1^2/2(Z_A^2+R_1^2)^{3/2}$$

Where, $\mu_0$ denotes permeability of vacuum, $Z_A$ denotes a distance between point A and a plane in which the second coil 22 is located, $R_1$ denotes a radius of the second coil 22, and $I_1$ denotes the product of the second current in the second coil 22 and the turns of the second coil 22.

Further, referring to FIG. 4B, the mask supporting coils 20 only include the first coil 21 and the second coil 22. In addition, the first coil 21 and the second coil 22 are both circular. The radius of the first coil 21 and that of the second coil 22 are equal, both of which are $R_1$. Both of the product of the magnitude of the first current of the first coil and the turns of the first coil and the product of the magnitude of the second current of the second coil and the turns of the second coil are $I_1$. The axis of the first coil 21 coincides with the axis of the second coil 22. The axis of the second coil 22 (or the first coil 21) intersects the plane in which the first coil 21 is located at a point C, and intersects the plane in which the second coil 22 is located at a point D. The length of line segment CD is the distance between the first coil 21 and the second coil 22. The middle point of the line segment CD is "0". A rectangular coordinate system is established by taking "0" as the origin of coordinates, taking any line parallel to the plane in which the second coil 22 (or the first coil 21) is located as axis X, and taking a line in which the axis of the second coil 22 (or the first coil 21) is located as axis Z. Then, the magnetic field's magnetic induction intensity $B_{z2}$ formed at point B on the axis by the mask supporting coils 20 is:

$$B_{Z2}=\mu_0 I_1 R_1^2 ((Z_B-d_1)^2+R_1^2)^{3/2}+\mu_0 I_1 R_1^2/2((Z_B+d_1)^2+R_1^2)^{3/2}$$

where $d_1$ denotes a half of the distance between the first coil 21 and the second coil 22, and $Z_B$ denotes a distance between the point B and point 0.

$B_{Z2}$ is an even function. In order to enable the magnetic field strength of the magnetic field generated by the mask supporting coils 20 to be homogeneous around positions where Z-coordinate is 0, let $d^2 B_{Z2}/dZ_B^2=0$ when Z approaches to zero, thereby obtaining $d_1=R_1/2$. That is, the magnetic field generated by the mask supporting coils 20 has an area of a homogeneous magnetic field strength when the radius $R_1$ of the first coil 21, the radius $R_1$ of the second coil 22 and the distance $2d_1$ between the first coil 21 and the second coil 22 are equal. In this case, the first coil 21 together with the second coil 22 constitutes a Helmholtz coil.

Figure 5A:
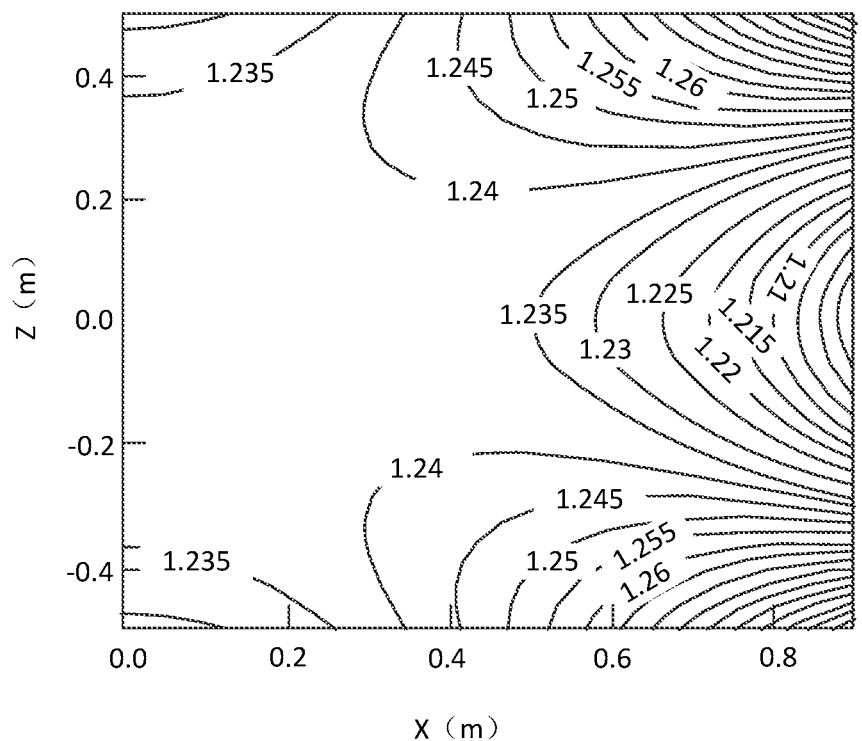
FIGS. 5A to 5C are schematic diagrams showing a magnetic field strength distribution of a Helmholtz coil obtained in a simulation manner.
Figure 5B:
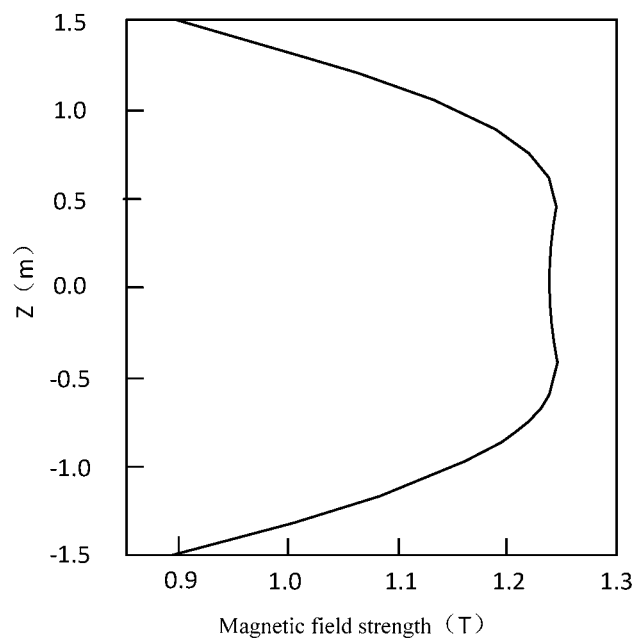
Figure 5C:
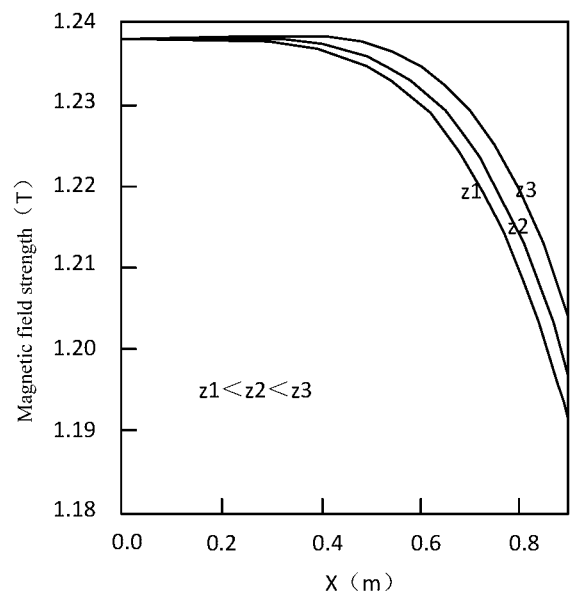

The magnetic field strength distribution of the magnetic field generated by the Helmholtz coil is studied below by means of simulation. Assuming that all of the radius $R_1$ of the first coil 21, the radius $R_1$ of the second coil 22 and the distance $2 d_1$ between the first coil 21 and the second coil 22 in FIG. 4B are equal to 1.732 m, a first current of a specific magnitude is provided in the first coil 21 and a second current of a specific magnitude is provided in the second coil 22, then the magnetic field strength distribution of the magnetic field generated between the first coil 21 and the second coil 22 are illustrated in FIG. 5A, FIG. 5B and FIG. 5C. The vertical axis in FIG. 5A and FIG. 5B denotes an axial direction of the Helmholtz coil (that is, the axial direction of the first coil 21 or the second coil 22), and corresponds to the direction of axis Z in FIG. 4B. The horizontal axis in FIG. 5A and FIG. 5C denotes a radial direction of the Helmholtz coil and corresponds to the direction of axis X in FIG. 4B, and the radial direction is perpendicular to the axial direction. All of the numerical values on the curves in FIG. 5A, the abscissa in FIG. 5B and the ordinate in FIG. 5C denote the magnetic field strength of the magnetic field, and the unit is Tesla (T).

It can be found in FIG. 5A that there is a region between the first coil 21 and the second coil 22 with a homogeneous magnetic field strength. FIG. 5B is a schematic diagram showing the magnetic field strength distribution along a line segment EF in FIG. 4B, which is parallel to the axis Z and 0.4 meters away from the axis Z (namely, X=0.4 m). It can be found in FIG. 5B that the magnetic field strength of the magnetic field is almost constant between Z=−0.5 m and Z=0.5 m. FIG. 5C is a schematic diagram showing a radial distribution of the magnetic field strength of the magnetic field when Z (Z>0) takes different values. It can be found in FIG. 5C, although there is a slight change in the magnetic field strength in the radial direction for any Z value (when Z=z1, the maximum change in the magnetic field strength in the radial direction is about 0.05 T, which is much smaller than the magnetic field strength of any position, the Z-coordinate of which is z1), the slight change in the magnetic field strength is within an allowable error range, and is negligible.

The above simulation data shows that a magnetic field with a homogeneous magnetic field strength can be formed in a relative large area by means of providing the first current and the second current in the first coil 21 and the second coil 22, respectively. The region with homogeneous magnetic field strength may be used as the mask disposing area 30.

In the specific use, the first current and the second current of suitable magnitudes may be selected according to the weight and size of the mask 31 and the number, shapes, sizes, etc. of coils in the mask supporting coils 20, so that the mask 31 disposed in the mask disposing area 30 is subjected to an attraction force equal to or slightly less than the gravity. This can enable the mask 31 to be at force balance. Therefore, the problem in the existing evaporation device that the mask 31 is fixed by the supporting frame 11 at the edge of the mask 31, and is likely deformed due to force imbalance, thereby affecting the evaporation effect, is solved. Therefore, an aim of avoiding the deformation of the mask 31 and improving the evaporation effect of the evaporation device is achieved.

On the basis of the above technical solution, when using an existing evaporation device, a glass substrate is typically fixed before evaporation, then the mask is attracted to a target position next to the glass substrate under the control of a magnet array so as to make the mask and the glass substrate contact each other, then the evaporation is performed. In practice operation, during the process of attracting the mask to the target position by the magnet array, the distance between the mask and the magnet array continually changes as the position of the mask continually changes, so that the attraction force exerted by the magnet array to which the mask is subjected increases exponentially with the change of the distance between the mask and the magnet array. Typically, the attraction force exerted by the magnet array to which the mask is subjected is about more than 100 times of the gravity acted on the mask when the mask moves to a position 10 millimeters from the magnet array. The acceleration of the mask is very great under such great attraction force, causing the mask to impact the glass substrate with a very great velocity eventually, which leads to a fold of the mask. Furthermore, if a photo-spacer is included on the glass substrate, the photo-spacer will be scratched and the display effect of the display panel is affected.

It is well known that the force F to which the ferromagnetic material is subjected in an inhomogeneous magnetic field B, the magnetic moment m of the ferromagnetic material and the magnetic field gradient obey the following function:

$$F=(m\cdot\nabla)B=m_x\frac{\partial B}{\partial x}+m_y\frac{\partial B}{\partial y}+m_z\frac{\partial B}{\partial z}$$

From the above equation, the force to which the ferromagnetic material is subjected in an inhomogeneous magnetic field is not only associated with the magnetic induction intensity but also associated with the magnetic field strength gradient at the position of the ferromagnetic material. Optionally, the evaporation device may be configured to further include mask conveying coils, so that the mask can move to the target position with a constant velocity or an approximate constant velocity. A current of a specific magnitude is provided in the mask conveying coils, so that the magnetic field strength gradient of the magnetic field generated in the mask disposing area is homogeneous, thereby controlling the moving velocity of the mask. It is also to be noted that, during a process of positioning the mask of embodiments of the present disclosure, a change of the force acted on the mask in the vertical direction is little and the force acted on the mask in the horizontal direction is nearly zero, so that the mask will not impact the glass substrate with a great velocity, thereby avoiding damaging the mask and scratching the photo-spacer.

Figure 6:
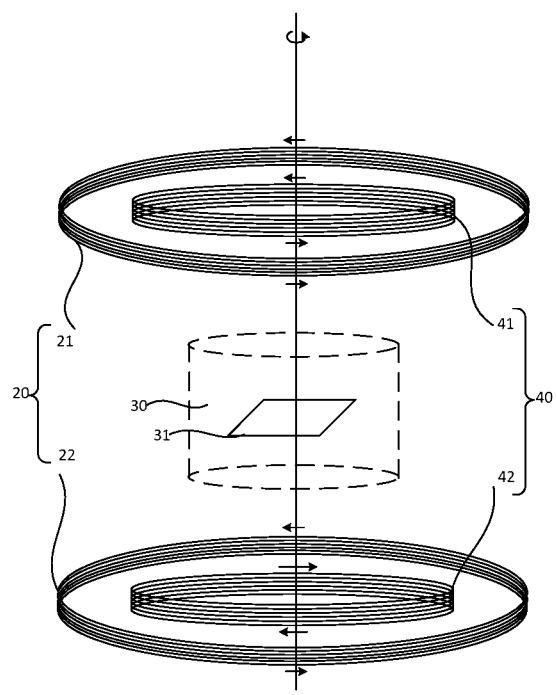
FIG. 6 is a schematic diagram showing an internal structure of another evaporation device according to an embodiment of the present disclosure.

FIG. 6 is a schematic diagram showing the internal structure of another evaporation device according to an embodiment of the present disclosure. Specifically, referring to FIG. 6, the evaporation device further includes at least one set of mask conveying coils 40 (only one set of mask conveying coils is included in the evaporation device as exemplarily shown in FIG. 6). The mask conveying coils 40 include a third coil 41 and a fourth coil 42 disposed opposite to each other. A third current is provided in the third coil 41 and a fourth current is provided in the fourth coil 42, so that the magnetic field strength gradient of the magnetic field generated in the mask disposing area 30 is homogeneous.

Optionally, the direction of the third current is the same as the first winding direction, while the direction of the fourth current is contrary to the first winding direction. A product of the magnitude of the third current and the turns of the third coil 41 is equal to a product of the magnitude of the fourth current and the turns of the fourth coil 42. An axis of the third coil 41 and an axis of the fourth coil 42 coincide. An axis of the mask conveying coils 40 and the axis of the mask supporting coils 20 coincide.

Similarly, the third coil 41 and the fourth coil 42 in the mask conveying coils 40 may be in a symmetric shape, or may be in an asymmetric shape. In the case that the third coil 41 and the fourth coil 42 are in a symmetric shape, the third coil 41 and the fourth coil 42 may circular, polygonal, elliptic or racetrack-shaped, etc.

It should be noted that, for different shapes of the third coil 41 and the fourth coil 42 in the mask conveying coils 40, conditions which are required to be met for generating by the mask conveying coils 40 a magnetic field with a homogeneous magnetic field strength gradient in the mask disposing area 30, are different. Taking a circus third coil 41 and fourth coil 42 as an example, the conditions which are required to be met for generating by the mask conveying coils 40 the magnetic field of the homogeneous magnetic field strength gradient, are derived below. For easy calculating, only the magnetic field generated at the axis of the third coil 41 by the mask conveying coils 40 is derived as an example herein.

Figure 7:
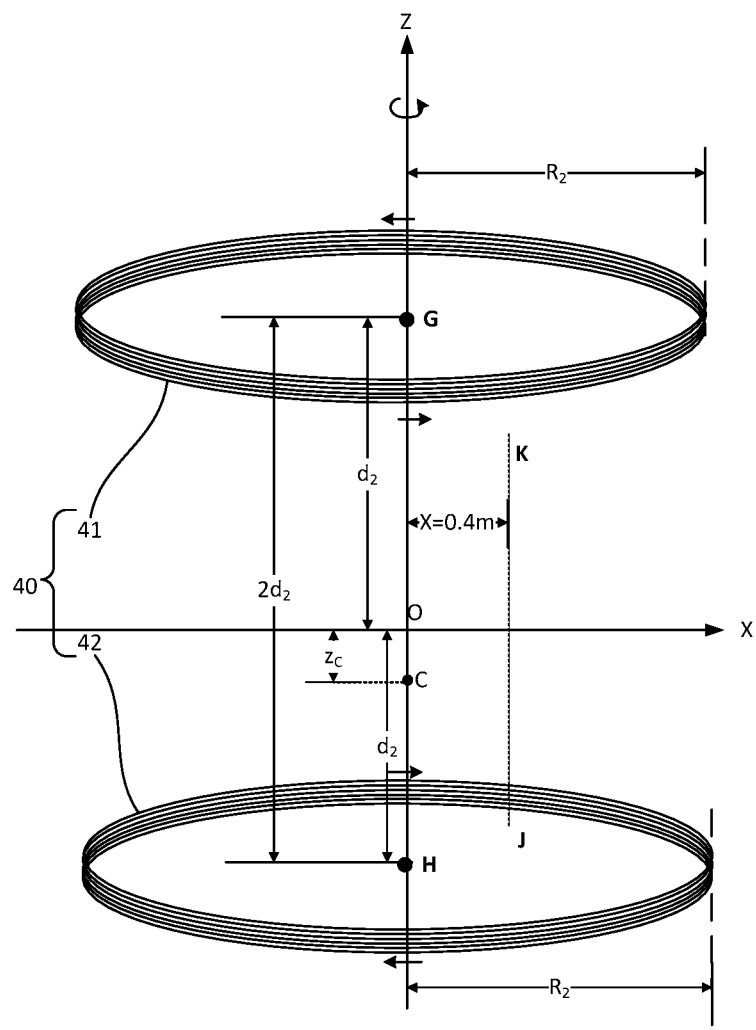
FIG. 7 is a schematic diagram showing the derivation process of a condition to be met when a magnetic field with a homogeneous magnetic field strength gradient is generated by the mask conveying coils.

FIG. 7 is a schematic diagram showing a process of deriving a condition which is required to be met for generating a magnetic field with a homogeneous magnetic field strength gradient by the mask conveying coils. Referring to FIG. 7, it is assumed that the radius of the third coil 41 in the mask conveying coils 40 and the radius of the fourth coil 42 in the mask conveying coils 40 are equal and are both $R_2$. Both of the product of the magnitude of the third current and the turns of the third coil 41 and the product of the magnitude of the fourth current and the turns of the fourth coil 42 are $I_2$. The axis of the third coil 41 and the axis of the fourth coil 42 coincide. The axis of the third coil 41 (or the fourth coil 42) intersects with a plane in which the third coil 41 is located at a point G, and intersects with a plane in which the fourth coil 42 is located at a point H. The length of line segment GH is the distance between the third coil 41 and the fourth coil 42. The middle point of the line segment GH is 0. A rectangular coordinate system is established by taking the point 0 as the origin of coordinates, taking any line parallel to the plane in which the third coil 41 (or the fourth coil 42) is located as axis X, and taking the line in which the axis of the third coil 41 (or the fourth coil 42) is located as axis Z. Then, the magnetic field's magnetic induction intensity $B_{z3}$ formed at point C on the axis of the mask conveying coils 40 is:

$$B_{Z3}=\mu_0 I_2 R_2^2/2(Z_C-d_2)^2+R_2^2)^{3/2}-\mu_0 I_2 R_2^2/2((Z_C+d_2)^2+R_2^2)^{3/2}$$

where $\mu_0$ denotes the permeability of vacuum, $d_2$ denotes a half of the distance between the third coil 41 and the fourth coil 42, and $Z_C$ denotes a distance between the point C and point 0.

$B_{Z3}$ is an odd function. In order to enable the magnetic field's magnetic field strength be homogeneous around positions where Z-coordinate is 0, let $d^3B_{Z3}/dZ_C^3=0$ when Z approaches to zero, thereby obtaining $2d_2=\sqrt{3}R_2$. That is, the magnetic field generated by the mask conveying coils 40 has an area of a homogeneous magnetic field strength gradient when the distance $2d_2$ between the third coil 41 and the fourth coil 42 is equal to $\sqrt{3}$ times of the radius $R_2$ of the third coil 41 (or the fourth coil 42). In this case, the third coil 41 together with the fourth coil 42 constitutes a Counter-Helmholtz coil.

Figure 8A:
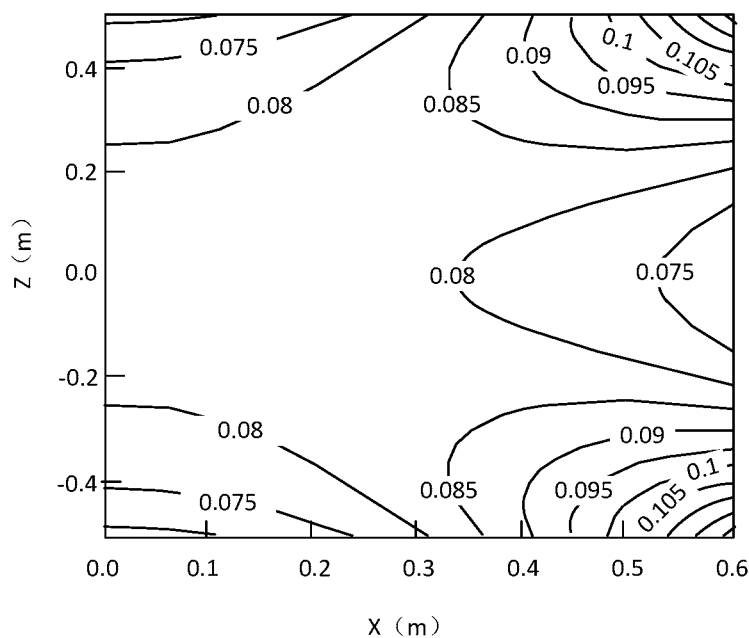
FIGS. 8A to 8C are schematic diagrams showing a magnetic field strength distribution of a Counter-Helmholtz coil obtained in a simulation manner.
Figure 8B:
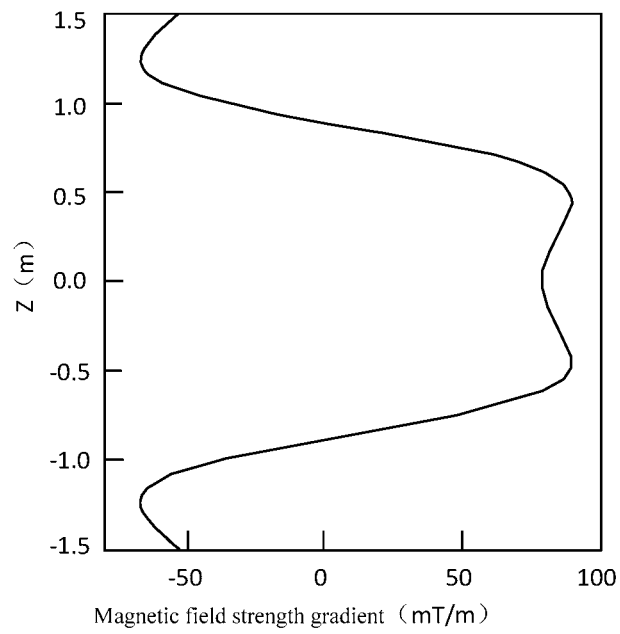
Figure 8C:
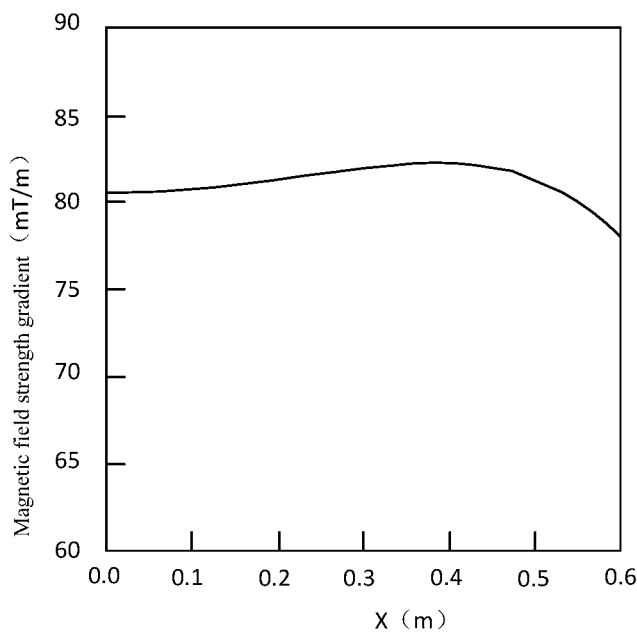

The distribution of the magnetic field strength gradient of the magnetic field generated by the Counter-Helmholtz coil is studied below be means of simulation. Referring to FIG. 7, assuming that both of the radius $R_2$ of the third coil 41 and the radius $R_2$ of the fourth coil 42 are 1 m, the distance $2d_2$ between the third coil 41 and the fourth coil 42 is 1.732 m, and a third current of a specific magnitude is provided in the third coil 41 and a fourth current of a specific magnitude is provided in the fourth coil 42, then the distribution of the magnetic field strength gradient of the magnetic field generated between the third coil 41 and the fourth coil 42 are illustrated in FIG. 8A, FIG. 8B and FIG. 8C. The vertical axis in FIG. 8A and FIG. 8B denotes an axial direction of the Counter-Helmholtz coil (that is, the axial direction of the third coil 41 or the fourth coil 42), and corresponds to the direction of axis Z in FIG. 7. The horizontal direction in FIG. 8A and FIG. 8C denotes a radial direction of the Counter-Helmholtz coil and corresponds to the direction of axis X in FIG. 7, and the radial direction is perpendicular to the axial direction. The numerical values on the curves in FIG. 8A, the abscissa in FIG. 8B and the ordinate in FIG. 8C denote the magnetic field strength gradient of the magnetic field, the unit of which is milli-Tesla per meter (mT/m).

It can be found in FIG. 8A that there is a region between the third coil 41 and the fourth coil 42 with a homogeneous magnetic field strength gradient. FIG. 8B is a schematic diagram showing the distribution of the magnetic field strength gradient along a line segment KJ in FIG. 7 parallel to the axis Z and 0.4 m away from the axis Z (namely, X=0.4 m). It can be found in FIG. 8B that the magnetic field strength gradient of the magnetic field changes gently between Z=−0.5 m and Z=0.5 m. FIG. 8C is a schematic diagram showing the radial distribution of the magnetic field strength gradient of the magnetic field when Z=0. It can be found in FIG. 8C, although there is a slight change in the magnetic field strength gradient in the radial direction, the slight change in the magnetic field strength gradient is within an allowable error range and is negligible.

The above simulation data shows that a magnetic field with a homogeneous magnetic field strength gradient can be generated in a relative large area by providing the third current and the fourth current in the third coil 41 and the fourth coil 42 respectively.

Figure 9:
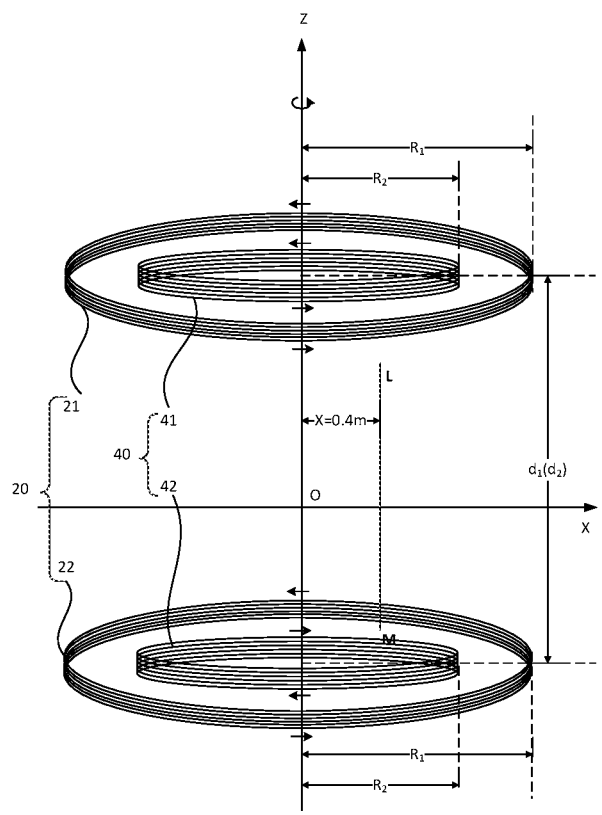
FIG. 9 is a schematic diagram showing an internal structure of another evaporation device according to an embodiment of the present disclosure.
Figure 10A:
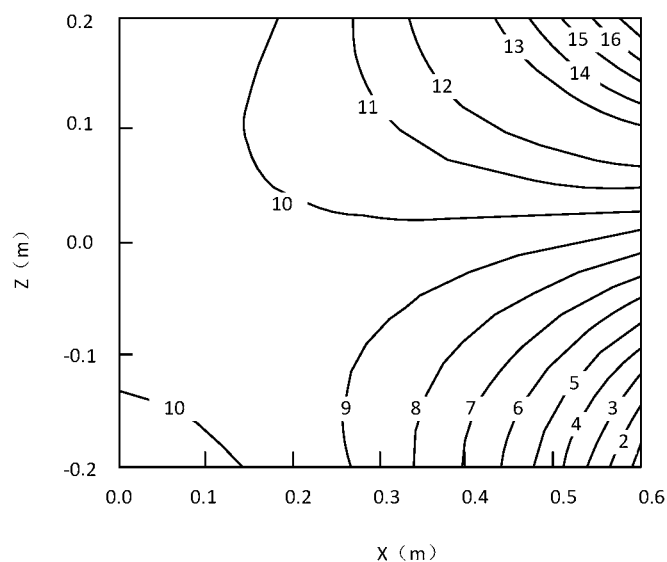
FIGS. 10A to 10C are schematic diagrams showing an acceleration distribution of the mask in the evaporation device of FIG. 9 generated due to the existence of a magnetic field.
Figure 10B:
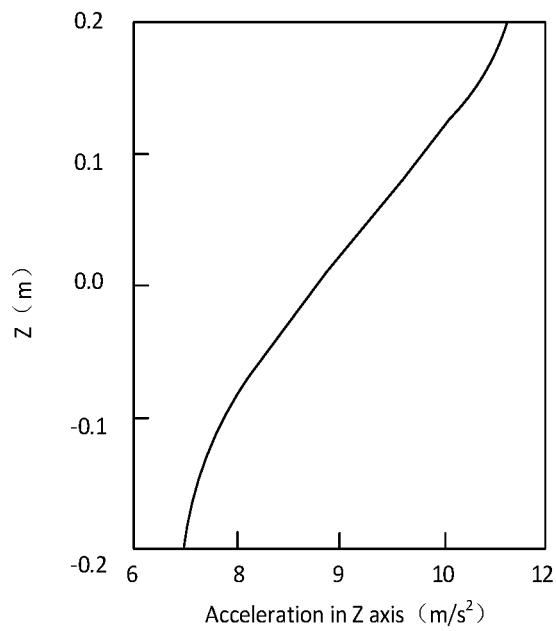
Figure 10C:
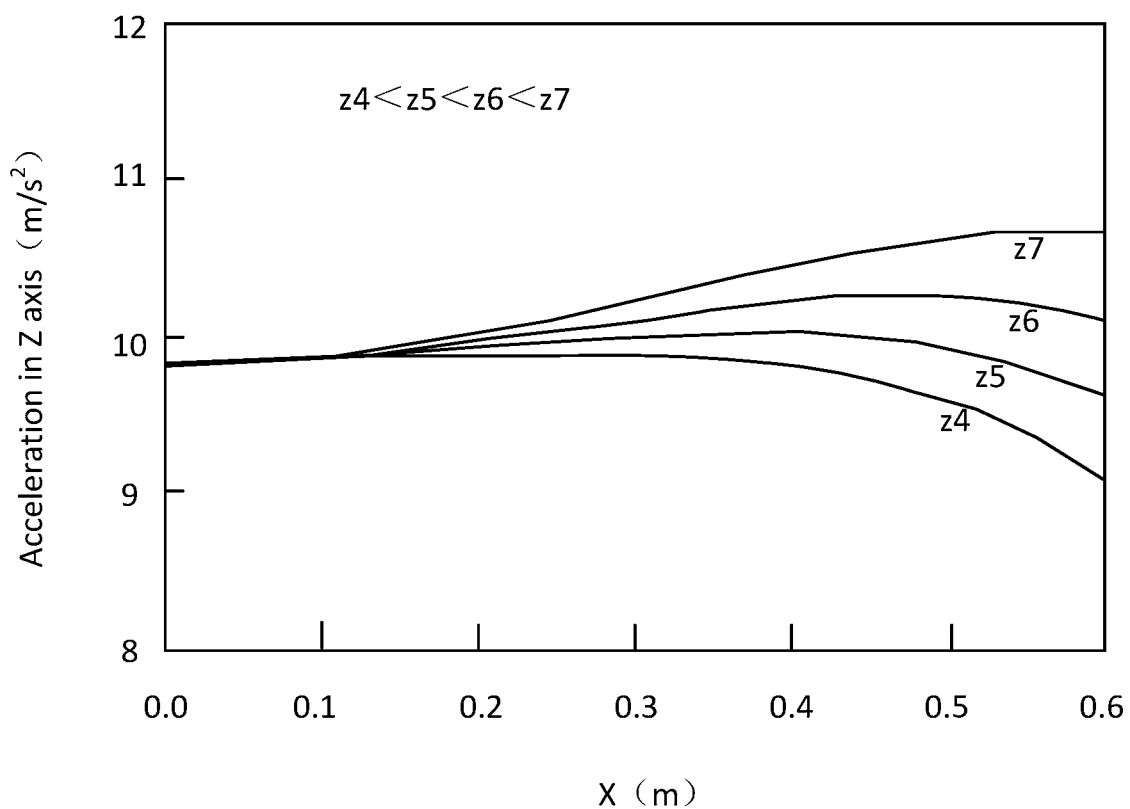

It is assumed in FIG. 9 that the radii $R_1$ of the first coil 21 and the second coil 22 are 1.732 m, the radii $R_2$ of the third coil 41 and the fourth coil 42 are 1 m, both of the distance $d_2$ between the third coil 41 and the fourth coil 42 and the distance $d_1$ between the first coil 21 and the second coil 22 are 1.732 m, the first coil 21 and the third coil 41 are in a same plane, and the second coil 22 and the fourth coil 42 are in a same plane. The distribution of accelerations, generated by the magnetic field, of the mask 31 at various locations of the evaporation device provided in FIG. 9 are illustrated in FIG. 10A, FIG. 10B and FIG. 10C. The vertical axis in FIG. 10A and FIG. 10B denotes the axial direction of the mask conveying coils 40 (or the mask supporting coils 20), and corresponds to the direction of axis Z in FIG. 9. The horizontal axis in FIG. 10A and FIG. 10C denotes the radial direction of the mask conveying coils 40 (or the mask supporting coils 20), and corresponds to the direction of axis X in FIG. 9, and the radial direction is perpendicular to the axial direction. The numerical values on the curves in FIG. 10A, the abscissa in FIG. 10B and the ordinate in FIG. 10C denote the mask 31's acceleration in the direction of axis Z at the position of the mask 31, which is generated by the magnetic field and the unit of which is meter per square seconds (m/s$^2$).

It can be found in FIG. 10A that the acceleration of the mask 31 within a specific area between the third coil 41 and the fourth coil 42 is extremely homogeneous. FIG. 10B is a schematic diagram showing the distribution of the acceleration along a line segment LM in FIG. 9 parallel to the axis Z and 0.4 m away from the axis Z (namely, X=0.4 m). It can be found in FIG. 10B that the acceleration of the mask 31 has an approximate linear distribution and approaches to the gravity acceleration in the axial direction (namely the direction of axis Z). FIG. 10C is a schematic diagram showing the radial distribution of the acceleration when Z (Z>0) takes different values. It can be found in FIG. 10C that the acceleration at positions near the axis (axis Z) is almost constant as the X value increases continuously. Although the acceleration at positions relative far away from the axis (axis X) changes, the change in acceleration is little. It should be noted that the change in acceleration is merely 0.15 times of the gravity acceleration when Z increases 3 cm (Z increases from $Z_4$ to $Z_7$) in FIG. 10C. No doubt, it is advantageous for controlling the moving velocity of the mask 31.

According to the technical solution of the present embodiment, the mask supporting coils and mask conveying coils are provided in the evaporation device, so that the mask supporting coils can generate a magnetic field with homogeneous magnetic field strength in the mask disposing area when the mask is still. As a result, the attraction force exerted by the mask supporting coils to which the mask is subjected to is equal to or slightly greater than the gravity acted on the mask. Accordingly, the mask is at force balance, and the bad phenomenon that the mask is deformed due to force imbalance is avoided. When the mask is in a moving state, the magnitude of the current in the mask conveying coils is controlled so as to control the magnitude of the acceleration of the movement of the mask, thereby controlling the moving velocity of the mask, and preventing the mask from impacting the glass substrate with an extremely great velocity, which will lead to the bad phenomenon of generating roughness on the mask and scratching the columnar photo-spacers inside the glass substrate, and affects the display effect. Meanwhile, during a locating process of the mask provided by embodiments of the present disclosure, the force exerted on the mask changes little in the vertical direction, and is nearly zero in the horizontal direction. Therefore, the mask will not impact the glass substrate with an extremely great velocity, thereby avoiding the problem of damaging the mask and scratching the photo-spacers.

In the specific design, the sizes of the mask supporting coils and the mask conveying coils and the position relationship between them may be varied. For example, in FIG. 9, the distance $d_1$ between the first coil 21 and the second coil 22 in the mask supporting coils 20 is equal to the distance $d_2$ between the third coil 41 and the fourth coil 42 in the mask conveying coils 40, and the first coil 21 and the third coil 41 are in a same plane, the second coil 22 and the fourth coil 42 are in a same plane, which is merely a specific example of the present disclosure rather than a limitation to the present disclosure. Optionally, as shown in FIG. 11, all of the radius $R_1$ of the first coil 21, the radius $R_1$ of the second coil 22, the radius $R_2$ of the third coil 41 and the radius $R_2$ of the fourth coil 42 are the same, and the first coil 21, the second coil 22, the third coil 41 and the fourth coil 42 are in different planes respectively.

Figure 11:
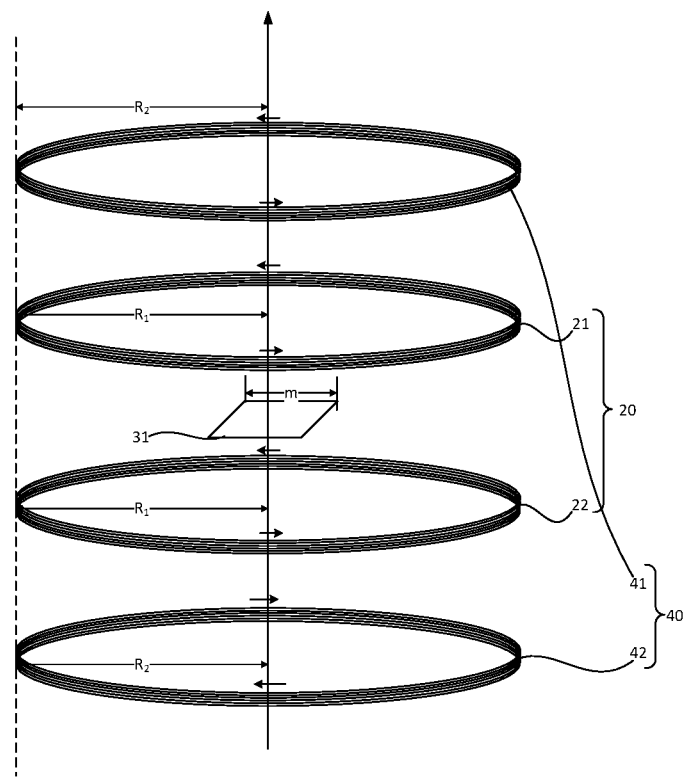
FIG. 11 is a schematic diagram showing an internal structure of another evaporation device according to an embodiment of the present disclosure.

In a practical evaporation, as shown in FIG. 11, the mask 31 has various shapes such as a circle, square, polygon, ellipse or racetrack and the like. During the evaporation, mask supporting coils 20 and mask conveying coils 40 of a suitable size and shape are selected according to the size and shape of the mask 31, so as to ensure that the entire mask 31 is in a region of homogeneous magnetic field strength and homogeneous magnetic field strength gradient. Exemplarily, if the mask 31 is rectangular, it is necessary to ensure that the radius $R_2$ of the third coil 41 is greater than the length of a long side m of the mask 31.

In the specific design, the current in the mask supporting coils 20 may be equal to the current in the mask conveying coils 40, alternatively, may be not equal to the current in the mask conveying coils 40. The greater the current in the mask supporting coils 20 (or the mask conveying coils 40) is, the more the heat generated on the mask supporting coils 20 (or the mask conveying coils 40) is. As a result, if the mask supporting coils 20 (or the mask conveying coils 40) operate for a long time, the mask supporting coils 20 (or the mask conveying coils 40) are likely to be burnt out. Therefore, optionally, the mask supporting coils 20 and the mask conveying coils 40 are provided with a cooling device. For better cooling, optionally, a ratio of the magnitude of the first current to the magnitude of the third current is greater than or equal to 0.1 and less than or equal to 10. Typically, the magnitude of the first current is equal to that of the third current.

Figure 12:
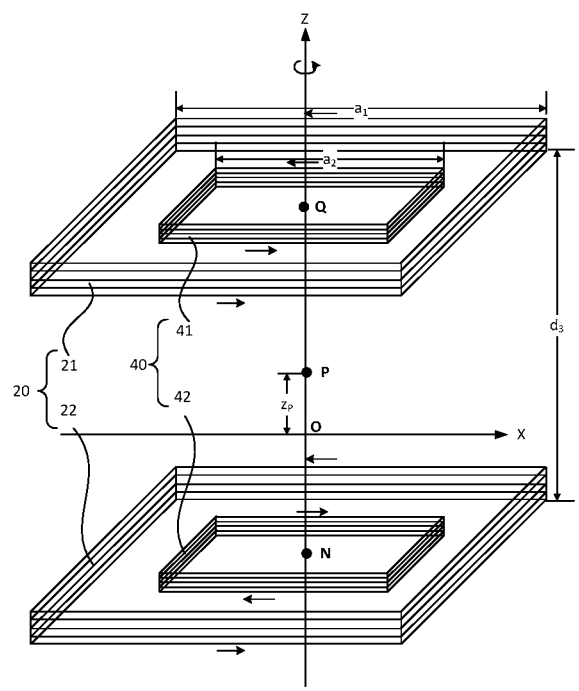
FIG. 12 is a schematic diagram showing an internal structure of another evaporation device according to an embodiment of the present disclosure.

FIG. 12 is a schematic diagram showing the internal structure of another evaporation device according to an embodiment of the present disclosure. Compared with FIG. 9 and FIG. 11, the first coil and second coil in the mask supporting coils are square. Referring to FIG. 12, the first coil 21 and second coil 22 in the mask supporting coils 20 are square. The side length of the first coil 21 is equal to the side length of the second coil 22, and the distance between the first coil 21 and second coil 22 is 0.5445 times of the side length of the first coil 21.

Referring to FIG. 12, a reason for setting the distance between the first coil 21 and the second coil 22 being equal to 0.5445 times of the side length of the first coil 21 is given below. It is assumed that both of the side length of the first coil 21 and the second coil 22 is $a_1$ and the distance between the first coil 21 and the second coil 22 is $d_3$; both of the product of the magnitude of the first current and the turns of the first coil and the product of the magnitude of the second current and the turns of the second coil are $I_3$; the axis of the mask supporting coils 20 (namely, the axis of the first coil 21 or the axis of the second coil 22) intersects the plane in which the first coil 21 is located at a point Q. The axis of the mask supporting coils 20 intersects the plane in which the second coil 22 is at located a point N; a middle point of a line between the point Q and the point N is the point "0". Based on the above, the magnetic field's magnetic induction intensity $B_{z4}$ formed at any point P on the axis of the mask supporting coils 20 is:

$$B_{Z4} = \frac{\mu_0 I_3 a_1^2}{2\pi \left[\frac{a_1^2}{4} + \left(Z_P - \frac{d_3}{2}\right)^2\right]\sqrt{\frac{a_1^2}{2} + \left(Z_P - \frac{d_3}{2}\right)^2}} +$$

$$\frac{\mu_0 I_3 a_1^2}{2\pi \left[\frac{a_1^2}{4} + \left(Z_P + \frac{d_3}{2}\right)^2\right]\sqrt{\frac{a_1^2}{2} + \left(Z_P + \frac{d_3}{2}\right)^2}}$$

where $\mu_0$ denotes permeability of vacuum, $Z_P$ denotes a distance between the point P and point 0.

$B_{z4}$ is an even function. In order to enable the magnetic field strength of the magnetic field to be homogeneous around positions Z-coordinates of which are 0, let $d^2B_{Z4}/dZ_P^2=0$ when Z approaches to zero, thereby obtaining $d_3 \approx 0.5445 a_1$. That is, the mask supporting coils 20 can generate a magnetic field with a homogeneous magnetic field strength when the distance $d_3$ between the first coil 21 and the second coil 22 is 0.5445 times of the side length $a_1$ of the first coil 21.

Further referring to FIG. 12, the evaporation device may further include a set of mask conveying coils 40. A third coil 41 and a fourth coil 42 in the mask conveying coils 40 are square, and the side length of the third coil 41 and the side length of the fourth coil 42 are equal. A distance between the third coil 41 and the fourth coil 42 is 0.94585 times of the side length of the third coil 41. The third coil 41 and the first coil 21 are in a same plane, and the fourth coil 42 and the second coil 22 are in a same plane. That is, the distance between the first coil 21 and the second coil 22 is equal to the distance between the third coil 41 and the fourth coil 42.

A reason for setting the distance between the third coil 41 and the fourth coil 42 being equal to 0.94585 times of the side length of the third coil 41 will be described below. It is assumed that both of the side length of the third coil 41 and the side length of the fourth coil 42 are $a_2$, and the distance between the third coil 41 and the fourth coil 42 is $d_3$; both of the product of the magnitude of the third current and the turns of the third coil 41 and the product of the magnitude of the fourth current and the turns of the fourth coil 42 are $I_4$; the axis of the mask conveying coil 40 (namely, the axis of the third coil 41 or the fourth coil 42) intersects the plane in which the third coil 41 is located at a point Q; the axis of the mask conveying coils 40 intersects the plane in which the fourth coil 42 is located at a point N; a middle point of a line between point Q and point N is the point 0. In this case, the magnetic field's magnetic field strength $B_{z5}$ formed at any point P on the axis of the mask conveying coils 40 is:

$$B_{Z5} = \frac{\mu_0 I_4 a_2^2}{2\pi \left[\frac{a_2^2}{4} + \left(Z_P - \frac{d_3}{2}\right)^2\right]\sqrt{\frac{a_2^2}{2} + \left(Z_P - \frac{d_3}{2}\right)^2}} +$$

$$\frac{\mu_0 I_4 a_2^2}{2\pi \left[\frac{a_2^2}{4} + \left(Z_P + \frac{d_3}{2}\right)^2\right]\sqrt{\frac{a_2^2}{2} + \left(Z_P + \frac{d_3}{2}\right)^2}}$$

where $\mu_0$ denotes permeability of vacuum, $Z_P$ denotes a distance between the point P and point 0.

$B_{Z5}$ is an odd function. In order to enable the magnetic field's magnetic field strength gradient to be homogeneous around positions Z-coordinates of which are 0, let $d^3B_{Z5}/dZ_P^3=0$ when Z approaches to zero, thereby obtaining $d_3 \leq 0.94585 a_2$. That is, the magnetic field generated by the mask conveying coils 40 is of a homogeneous magnetic field strength gradient when the distance $d_3$ between the third coil 41 and the fourth coil 42 is 0.94585 times of the side length $a_2$ of the third coil 41.

Figure 13:
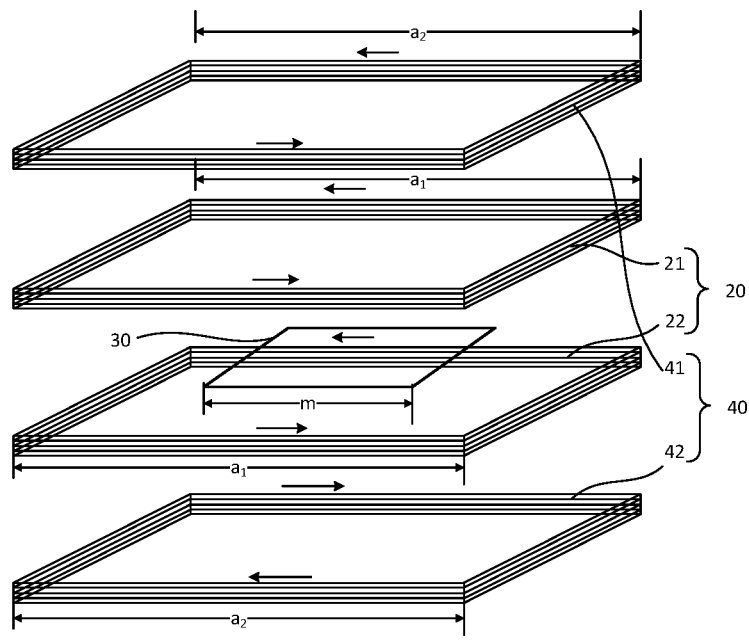
FIG. 13 is a schematic diagram showing an internal structure of another evaporation device according to an embodiment of the present disclosure.

Similarly, as shown in FIG. 12, the distance between the first coil 21 and the second coil 22 in the mask supporting coils 20 is set to be equal to the distance between the third coil 41 and the fourth coil 42 in the mask conveying coils 40, the first coil 21 and the third coil 41 are located in a same plane, and the second coil 22 and the fourth coil 42 are located in a same plane, the above arrangement is merely a specific embodiment of the present disclosure rather than a limitation to the disclosure. In the specific design, the sizes of the mask supporting coils 20 and the mask conveying coils 40 and the position relationship between them may be varied. Optionally, as shown in FIG. 13, the side length $a_1$ of the first coil 21, the side length $a_1$ of the second coil 22, the side length $a_2$ of the third coil 41 and the side length $a_2$ of the fourth coil 42 are equal, and the first coil 21, the second coil 22, the third coil 41 and the fourth coil 42 are located in different planes.

In a practical evaporation, the mask 31 has various shapes such as a circle, square, polygon, and the like. During evaporation, mask supporting coils 20 and mask conveying coils 40 of a suitable size and shape are selected according to the size and shape of the mask 31, so as to ensure that the entire mask 31 is in a region of homogeneous magnetic field strength and homogeneous magnetic field strength gradient. Exemplarily, if the mask 31 is rectangular, it is necessary to ensure that the side length $a_2$ of the third coil 41 is greater than the length of a long side m of the mask 31 when adopting the evaporation device of FIG. 13.

Further, for preventing the mask supporting coils 20 (or the mask conveying coils 40) from being easily burnt out due to long time operation, optionally, the mask supporting coils 20 and the mask conveying coils 40 are provided with a cooling apparatus. For better cooling, a ratio of the magnitude of the first current to the magnitude of the third current may be greater than or equal to 0.1 and less than or equal to 10. Typically, the magnitude of the first current is equal to that of the third current.

Each of the mask supporting coils in the evaporation devices provided by the above technical solutions includes two coils. In the practical design, the mask supporting coils may include three coils, four coils, five coils, or more coils. Several typical mask supporting coils are described below.

Figure 14:
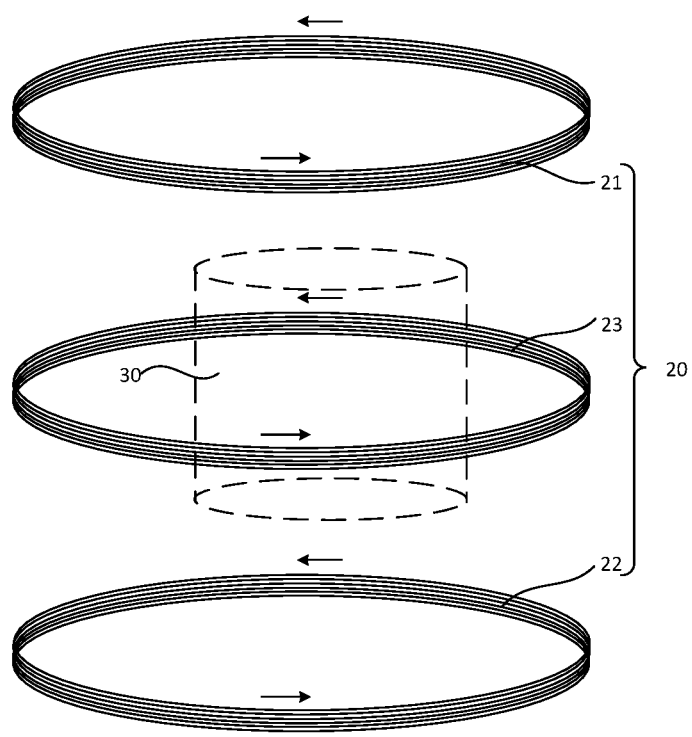
FIG. 14 is a schematic diagram showing a structure of another mask supporting coils according to an embodiment of the present disclosure.

FIG. 14 is a schematic diagram showing the structure of another mask supporting coils according to an embodiment of the present disclosure. Compared with the above technical solutions, the mask supporting coils 20 in the evaporation device shown in FIG. 0.14 totally include three coils. Specifically, referring to FIG. 14, the mask supporting coils 20 include a first coil 21, a second coil 22 and a fifth coil 23.

The fifth coil 23 is disposed between the first coil 21 and the second coil 22, and coaxially arranged with the first coil 21 and the second coil 22. A fifth current is provided in the fifth coil 23 to cooperate with the first coil and the second coil, so that a magnetic field with homogenous magnetic field strength is generated in the mask disposing area 30.

Figure 15:
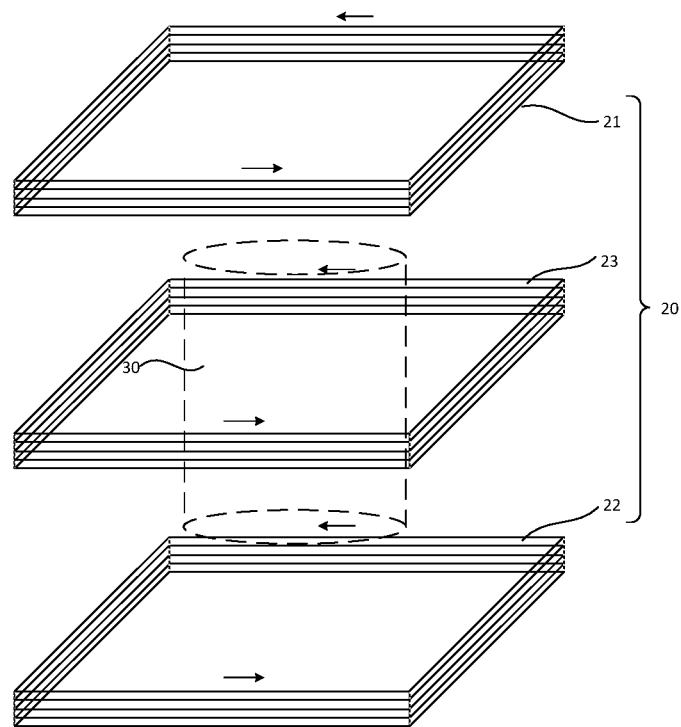
FIG. 15 is a schematic diagram showing a structure of another mask supporting coils according to an embodiment of the present disclosure.

As shown in FIG. 14, the first coil 21, the second coil 22 and the fifth coil 23 are circular, which is merely a specific embodiment, rather than a limitation to the present disclosure. In the specific setting, the coils in the mask supporting coils may be circular, polygonal, elliptic, racetrack-shaped and the like. Referring to FIG. 15, the first coil 21, the second coil 22 and the fifth coil 23 in the mask supporting coils 20 are square. Further, the side length of the first coil 21, the second coil 22 and the fifth coil 23 may be set to be equal, and both of a distance between the first coil 21 and the fifth coil 23 and a distance between the second coil 22 and the fifth coil 23 are set to be equal to 0.4106 times of the side length of the first coil 21 (or the second coil 22 or the fifth coil 23).

Figure 16:
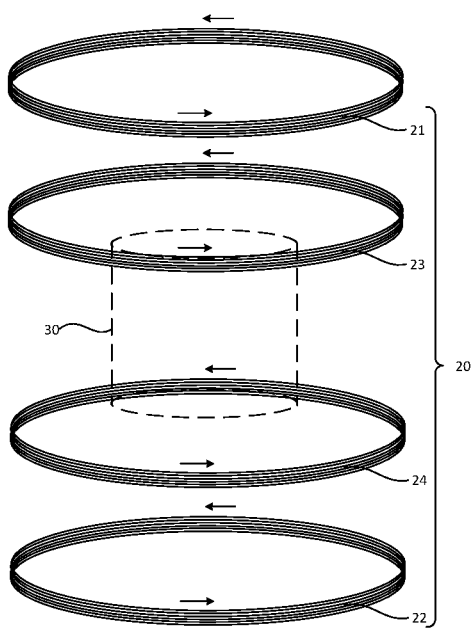
FIG. 16 is a schematic diagram showing a structure of another mask supporting coils according to an embodiment of the present disclosure.

FIG. 16 is a schematic diagram showing the structure of another mask supporting coil according to an embodiment of the present disclosure. Compared with the above technical solutions, the mask supporting coils 20 in the evaporation device shown in FIG. 0.16 totally includes four coils. Specifically, referring to FIG. 16, the mask supporting coils 20 include a first coil 21, a second coil 22, a fifth coil 23 and a sixth coil 24. The fifth coil 23 and the sixth coil 24 are disposed between the first coil 21 and the second coil 22, and coaxially arranged with the first coil 21 and the second coil 22. The first coil 21, the fifth coil 23, the sixth coil 24 and the second coil 22 are successively arranged in the axial direction. A fifth current is provided in the fifth coil 23 and a sixth current is provided in the sixth coil 24 to cooperate with the first coil and the second coil, so that a magnetic field with a homogenous magnetic field strength is generated in the mask disposing area 30.

Similarly, in a specific configuration, the coils in the mask supporting coils may be circular, polygonal, elliptic, racetrack-shaped and the like. Optionally, referring to FIG. 16, if each of the first coil 21, the second coil 22, the fifth coil 23 and the sixth coil 24 is circular, the radii of the first coil 21, the second coil 22, the fifth coil 23 and the sixth coil 24 may be set to be equal; the distance between the first coil 21 and the fifth coil 23 and the distance between the sixth coil 24 and the second coil 22 may be set to be equal to 0.6966 times of the radius of the first coil 21; and the distance between the fifth coil 23 and the sixth coil 24 is set to be equal to 0.4864 times of the radius of the first coil 21. In one implementation of the above embodiments of the present disclosure, the turns of the first coil 21, the second coil 22, the fifth coil 23, and the sixth coil 24 are equal, and the magnitudes of the currents provided in the coils satisfies the following ration: a ratio of the magnitude of the first current/the fifth current/the sixth current/the second current is 9:4:4:9.

Figure 17:
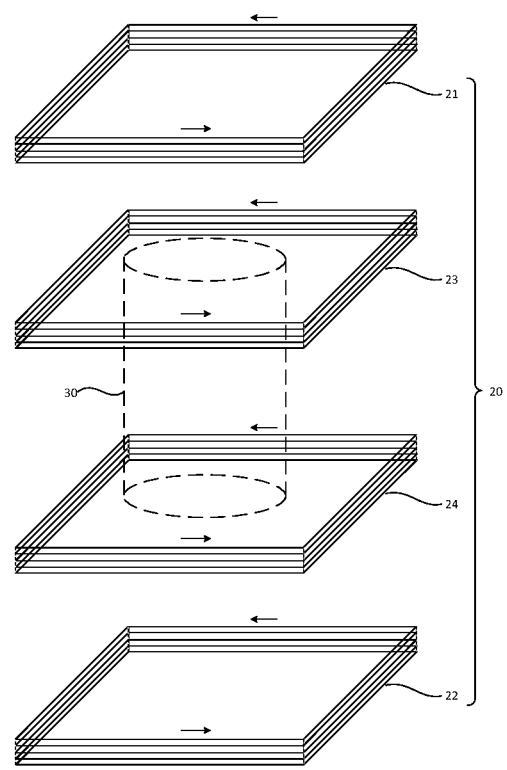
FIG. 17 is a schematic diagram showing a structure of another mask supporting coils according to an embodiment of the present disclosure.

Referring to FIG. 17, if each of the first coil 21, the second coil 22, the fifth coil 23 and the sixth coil 24 is square, the side length of the first coil 21, the second coil 22, the fifth coil 23 and the sixth coil 24 may be set to be equal, both of the distance between the first coil 21 and the fifth coil 23 and the distance sixth coil 24 and the second coil 22 may be set to be equal to 0.3774 times of the side length of the first coil 21, and the distance between fifth coil 23 and the sixth coil 24 may be set to be equal to 0.2562 times of the side length of the first coil 21.

Figure 18:
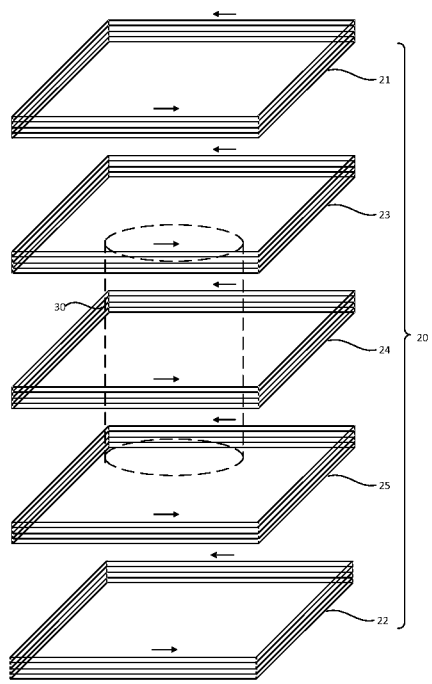
FIG. 18 is a schematic diagram showing a structure of another mask supporting coils according to an embodiment of the present disclosure.

FIG. 18 is a schematic diagram showing the structure of another mask supporting coils according to an embodiment of the present disclosure. Compared with the above technical solutions, the mask supporting coils 20 in the evaporation device shown in FIG. 18 totally include five coils. Specifically, referring to FIG. 18, the mask supporting coils 20 include a first coil 21, a second coil 22, a fifth coil 23, a sixth coil 24 and a seventh coil 25. The fifth coil 23, the sixth coil 24 and the seventh coil 25 are disposed between the first coil 21 and the second coil 22, and coaxially arranged with the first coil 21 and the second coil 22. The first coil 21, the fifth coil 23, the sixth coil 24, the seventh coil 25 and the second coil 22 are successively arranged in the axial direction. A fifth current is provided in the fifth coil 23, a sixth current is provided in the sixth coil 24 and a seventh current is provided in the seventh coil 25 to cooperate with the first coil and the second coil, so that a magnetic field with a homogenous magnetic field strength is generated in the mask disposing area 30.

Similarly, in a specific configuration, the coils in the mask supporting coils may be circular, polygonal, elliptic, racetrack-shaped and the like. Exemplarily, referring to FIG. 18, if each of the first coil 21, the second coil 22, the fifth coil 23, the sixth coil 24 and the seventh coil 25 is square, the side length of the first coil 21, the second coil 22, the fifth coil 23, the sixth coil 24 and the seventh coil 25 may be set to be equal, the distance between the first coil 21 and the fifth coil 23, the distance between the fifth coil 23 and the sixth coil 24, the distance between the sixth coil 24 and the seventh coil 25 and the distance between the seventh coil 25 and the second coil 22 may be set to be equal to 0.25 times of the side length of the first coil 21.

It should be noted that the more the coils included in the mask supporting coils, the more homogenous the magnetic field strength of the magnetic field in the mask disposing area is. It should be understood by those skilled in the arts, the number of coils included in the mask supporting coils of the embodiments of the present disclosure is not limited to three, four or five. The size of each coil, the current loaded to each coil and the distance between coils may be set according to the number of the coils, so as to constitute a set of Helmholtz coils and ensure to provide a homogeneous magnetic field strength for the mask disposing area.

Figure 19:
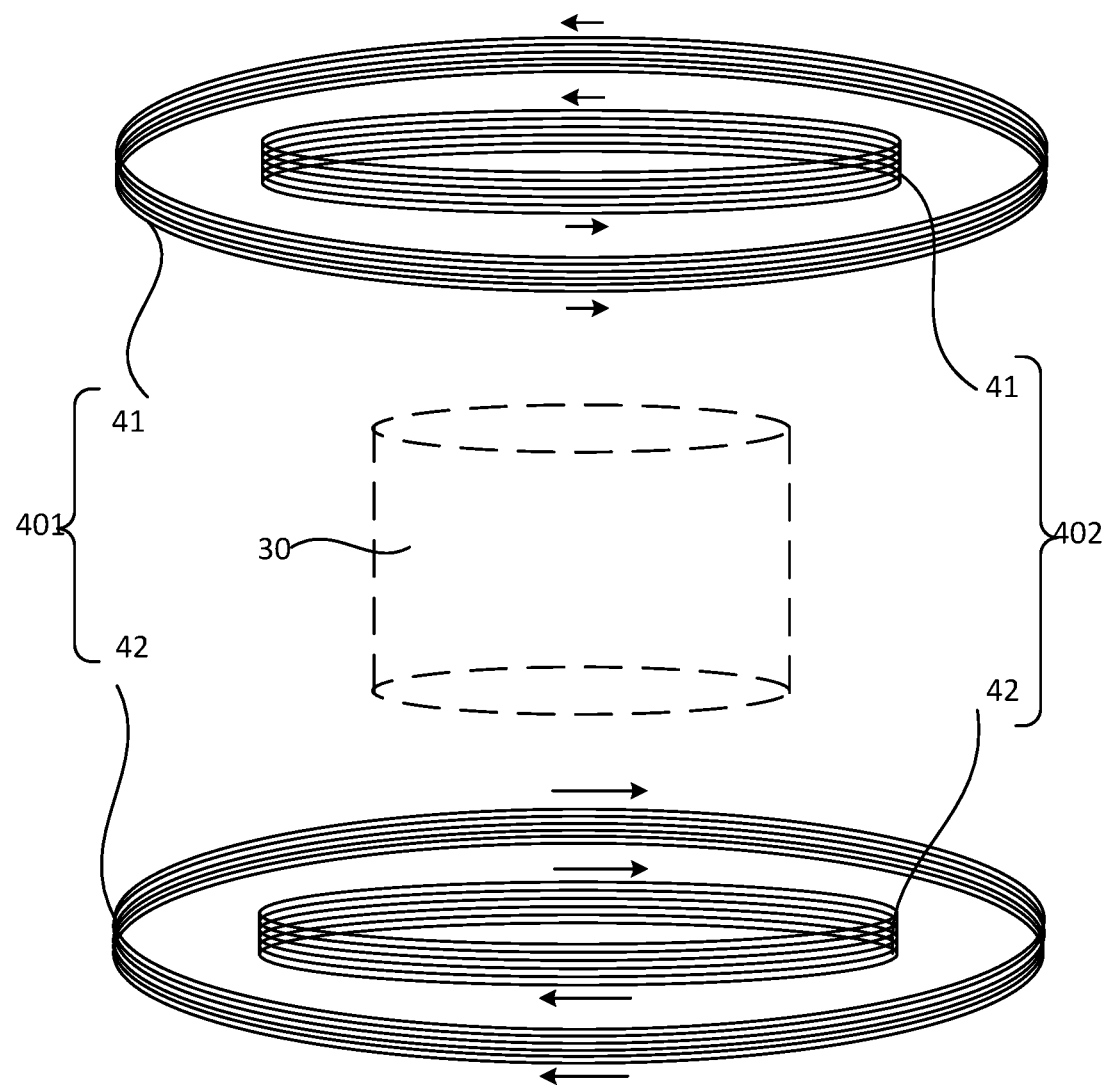
FIG. 19 is a schematic diagram showing a structure of another mask conveying coils according to an embodiment of the present disclosure.

In the above technical solutions, the evaporation device only includes one set of mask conveying coils. In a practical configuration, the evaporation device may further include two or more sets of mask conveying coils. FIG. 19 is a schematic diagram showing the structure of an evaporation device including two sets of mask conveying coils. Referring to FIG. 19, the evaporation device includes a first set of mask conveying coils 401 and a second set of mask conveying coils 402. An axis of the first set of mask conveying coils 401 and an axis of the second set of mask conveying coils 402 coincide. In the first set of mask conveying coils 401, a third coil 41 and a fourth coil 42 are circular, and both of the radius of the third coil 41 and the radius of the fourth coil 42 are equal to 0.74 times of a distance between third coil 41 and the fourth coil 42. In the second set of mask conveying coils 402, a third coil 41 and a fourth coil 42 are circular, and both of the radius of the third coil 41 and the radius of the fourth coil 42 are equal to 0.27 times of a distance between third coil 41 and the fourth coil 42. The third coil 41 of the first set of mask conveying coils 401 and the third coil 41 of the second set of mask conveying coils 402 are located in a same plane, and the fourth coil 42 of the first set of mask conveying coils 401 and the fourth coil 42 of the second set of mask conveying coils 402 are located in a same plane.

The more the sets of mask conveying coils included in the evaporation device are, the more homogeneous the magnetic gradient of the magnetic field in the mask supporting area is. It should be understood by those skilled in the arts, the number of sets of mask conveying coils of the embodiments of the present disclosure is not limited to one set or two set. The mask conveying coils may be composed of a plurality of Counter-Helmholtz coils which are coaxially arranged with equal intervals, gradually reduced in radius, and mutually nested, so as to ensure to provide a homogeneous magnetic gradient for the mask disposing area.

It should be noted that embodiments of the present disclosure provide various mask supporting coils and various mask conveying coils. In the practical design, any mask supporting coil and any mask conveying coil may be selected and combined to constitute an evaporation device including the mask supporting coils and the mask conveying coils.

Optionally, based on the above technical solutions, the evaporation device may further include a cooling apparatus for cooling the mask supporting coils and the mask conveying coils, alternatively, for cooling only one of the mask supporting coils and the mask conveying coils. The present disclosure is not limited to this and depends on specific situations.

To sum up, according to embodiments of the present disclosure, a magnetic field with a homogeneous magnetic field strength is generated in the mask disposing area by utilizing the mask supporting coils, so that the central area of the mask disposed in the mask disposing area is in force equilibrium. Embodiments of the present disclosure solves a problem in the existing evaporation device that the supporting frame fixes the mask at the edge of the mask, the mask is likely deformed since the central area is subjected to non-equilibrium forces and thereby affecting the evaporation effect. An aim of avoiding undesirable phenomenon that the central area of the mask will be deformed because of being suffered non-equilibrium forces and improving the evaporation effect of the evaporation device is realized. Meanwhile, during a process of positioning the mask provided by embodiments of the present disclosure, the force exerted on the mask changes a little in the vertical direction and is nearly zero in the horizontal direction, so that the mask will not impact the substrate with a very high velocity, thereby avoiding damaging the mask and scratching photo spacers.

It is to be noted that the above is only embodiments of the present disclosure and the technical principle applied thereto. It will be understood by those skilled in the art that the present disclosure is not limited to the specific embodiments described herein. Those skilled in the art can make various other apparent changes, rearrangements and substitutions without departing from the scope of the disclosure. Thus, although the present disclosure has been described in detail with reference to the above embodiments, the present disclosure is not limited to the above embodiments, and the present disclosure may be embodied in other equivalent forms without departing from the scope of the present disclosure. The scope of the present disclosure is determined by the scope of the appended claims.

What is claimed is:

1. An evaporation device, comprising:
    a deposition chamber;
    a first coil;
    a second coil;
    a third coil; and
    a fourth coil;
    wherein a plane where a mask is located is between the first coil and the second coil, and the plane where the mask is located is between the third coil and the fourth coil, wherein a distance between the plane where the mask is located and the first coil is equal to a distance between the plane where the mask is located and the second coil,
    wherein the third coil is surrounded by the first coil and is spaced apart from the first coil, and the fourth coil is surrounded by the second coil and is spaced apart from the second coil,
    wherein axes of the first coil and the second coil coincide, axes of the third coil and the fourth coil coincide, the axes of the first coil and the second coil, and the axes of the third coil and the fourth coil coincide and are perpendicular to the mask, wherein the first and the second coils are mask supporting coils and the third and fourth coils are mask conveying coils.

2. The evaporation device according to claim 1, wherein the mask is made from ferromagnetic materials.

3. The evaporation device according to claim 1, wherein a first current applied to the first coil and a second current applied to the second coil have a same direction, and a product of a magnitude of the first current and the number of turns of the first coil is equal to a product of a magnitude of the second current and the number of turns of the second coil.

4. The evaporation device according to claim 1, wherein a direction of a third current applied to the third coil is contrary to a direction of a fourth current applied to the fourth coil, and a product of a magnitude of the third current and the number of turns of the third coil is equal to a product of a magnitude of the fourth current and the number of turns of the fourth coil.

5. The evaporation device according to claim 1, wherein each of the first coil, the second coil, the third coil and the fourth coil is of a symmetric shape.

6. The evaporation device according to claim 5, wherein each of the first coil, the second coil, the third coil and the fourth coil is one of circular, polygonal, elliptic and racetrack-shaped.

7. The evaporation device according to claim 6, wherein the first coil and the second coil are circular; and
    a distance between the first coil and the second coil, a radius of the first coil and a radius of the second coil are equal to each other.

8. The evaporation device according to claim 7, wherein the third coil and the fourth coil are circular;
    a radius of the third coil is equal to a radius of the fourth coil; and
    a distance between the third coil and the fourth coil is $\sqrt{3}$ times of the radius of the third coil.

9. The evaporation device according to claim 8, wherein the distance between the first coil and the second coil is equal to the distance between the third coil and the fourth coil; or
    the radius of the first coil, the radius of the second coil, the radius of the third coil and the radius of the fourth coil are equal to each other.

10. The evaporation device according to claim 8, wherein the mask is rectangular and the radius of the third coil is greater than a length of a long side of the mask.

11. The evaporation device according to claim 8, wherein a ratio of the magnitude of the first current to the magnitude of the third current is greater than or equal to 0.1 and less than or equal to 10.

12. The evaporation device according to claim 11, wherein the magnitude of the first current is equal to the magnitude of the third current.

13. The evaporation device according to claim 6, wherein the first coil and the second coil are square; and
a side length of the first coil is equal to a side length of the second coil, and a distance between the first coil and the second coil is 0.5445 times of the side length of the first coil.

14. The evaporation device according to claim 13, wherein
the third coil and the fourth coil are square, and a side length of the third coil is equal to a side length of the fourth coil; and
a distance between the third coil and the fourth coil is 0.94585 times of the side length of the third coil.

15. The evaporation device according to claim 14, wherein
the distance between the first coil and the second coil is equal to the distance between the third coil and the fourth coil; or
the side length of the first coil, the side length of the second coil, the side length of the third coil and the side length of the fourth coil are equal to each other.

16. The evaporation device according to claim 14, wherein the mask is rectangular, and the side length of the third coil is larger than a length of a long side of the mask.

17. The evaporation device according to claim 14, wherein a ratio of the magnitude of the first current to the magnitude of the third current is greater than or equal to 0.1 and less than or equal to 10.

18. The evaporation device according to claim 17, wherein the magnitude of the first current is equal to the magnitude of the third current.

19. The evaporation device according to claim 1, wherein the evaporation device further comprises a fifth coil, wherein the fifth coil is disposed between the first coil and the second coil and is coaxially arranged with the first coil and the second coil; and
a fifth current is provided in the fifth coil to cooperate with the first coil and the second coil.

20. The evaporation device according to claim 19, wherein
the first coil, the second coil and the fifth coil are square, and a side length of the first coil, a side length of the second coil and a side length of the fifth coil are equal to each other; and
each of a distance between the first coil and the fifth coil and a distance between the second coil and the fifth coil is equal to 0.4106 times of the side length of the first coil.

21. The evaporation device according to claim 1, wherein the evaporation device further comprises a fifth coil and a sixth coil, wherein
the fifth coil and the sixth coil are disposed between the first coil and the second coil, and are coaxially arranged with the first coil and the second coil;
the first coil, the fifth coil, the sixth coil and the second coil are successively arranged along an axis;
to cooperate with the first coil and the second coil, a fifth current is provided in the fifth coil and a sixth current is provided in the sixth coil.

22. The evaporation device according to claim 21, wherein
the first coil, the second coil, the fifth coil and the sixth coil are circular and has a same radius, and the turns of the first coil, the turns of the second coil, the turns of the fifth coil and the turns of the sixth coil are equal to each other;
each of a distance between the first coil and the fifth coil and a distance between the sixth coil and the second coil is equal to 0.6966 times of the radius of the first coil, and a distance between the fifth coil and the sixth coil is equal to 0.4864 times of the radius of the first coil; and
a magnitude ratio of the first current, the fifth current, the sixth current, the second current is 9:4:4:9.

23. The evaporation device according to claim 21, wherein
each of the first coil, the second coil, the fifth coil and the sixth coil is square, the side length of the first coil, the side length of the second coil, the side length of the fifth coil and the side length of the sixth coil are equal to each other; and
each of a distance between the first coil and the fifth coil and a distance between the sixth coil and the second coil is equal to 0.3774 times of the side length of the first coil, and a distance between the fifth coil and the sixth coil is equal to 0.2562 times of the side length of the first coil.

24. The evaporation device according to claim 1, wherein the evaporation device further comprises a fifth coil, a sixth coil and a seventh coil, wherein
the fifth coil, the sixth coil and the seventh coil are disposed between the first coil and the second coil, and coaxially arranged with the first coil and the second coil;
the first coil, the fifth coil, the sixth coil, the seventh coil and the second coil are successively arranged along an axis; and
to cooperate with the first coil and the second coil, a fifth current is provided in the fifth coil, a sixth current is provided in the sixth coil and a seventh current is provided in the seventh coil.

25. The evaporation device of claim 24, wherein
each of the first coil, the fifth coil, the sixth coil, the seventh coil and the second coil is square, and a side length of the first coil, a side length of the second coil, a side length of the fifth coil, a side length of the sixth coil and a side length of the seventh coil are equal to each other; and
each of a distance between the first coil and the fifth coil, a distance between the fifth coil and the sixth coil, a distance between the sixth coil and the seventh coil and a distance between the seventh coil and the second coil is equal to 0.25 times of the side length of the first coil.

26. The evaporation device according to claim 1, wherein the evaporation device further comprises an eighth coil and a ninth coil,
the third coil and the fourth coil are circular, and each of a radius of the third coil and a radius of the fourth coil is equal to 0.74 times of a distance between the third coil and the fourth coil;
the eighth coil and the ninth coil are circular, and each of a radius of the eighth coil and a radius of the ninth coil is equal to 0.27 times of a distance between the eighth coil and the ninth coil; and the third coil and the eighth coil are located in a same plane, and the fourth coil and the ninth coil are located in a same plane.

27. The evaporation device according to claim 1, further comprising a cooling apparatus configured to cool the first coil, the second coil, the third coil and the fourth coil.

28. An evaporation device, comprising:
a deposition chamber;
a first coil;
a second coil;
a third coil; and
a fourth coil;
wherein a plane where a mask is located is between the first coil and the second coil, and the plane where the mask is located is between the third coil and the fourth coil, wherein a distance between the plane where the mask is located and the first coil is equal to a distance between the plane where the mask is located and the second coil,
wherein the third coil is surrounded by the first coil and is spaced apart from the first coil, and the fourth coil is surrounded by the second coil and is spaced apart from the second coil,
wherein projection of the mask on a plane perpendicular to the axis of the first coil is respectively located projections of the first coil, the second coil, the third coil and the fourth coil on the plane perpendicular to the axis of the first coil, wherein the first and the second coils are mask supporting coils and the third and fourth coils are mask conveying coils.

29. An evaporation device, comprising:
a deposition chamber;
a first coil;
a second coil;
a third coil; and
a fourth coil;
wherein a plane where a mask is located is between the first coil and the second coil, and the plane where the mask is located is between the third coil and the fourth coil, wherein a distance between the plane where the mask is located and the first coil is equal to a distance between the plane where the mask is located and the second coil,
wherein the third coil is surrounded by the first coil and is spaced apart from the first coil, and the fourth coil is surrounded by the second coil and is spaced apart from the second coil,
wherein a distance between the first coil and the second coil is equal to a distance between the third coil and the fourth coil, wherein the first and the second coils are mask supporting coils and the third and fourth coils are mask conveying coils.

* * * * *